United States Patent
Vikharev et al.

(10) Patent No.: US 7,694,651 B2
(45) Date of Patent: Apr. 13, 2010

(54) HIGH VELOCITY METHOD FOR DEPOSING DIAMOND FILMS FROM A GASEOUS PHASE IN SHF DISCHARGE PLASMA AND DEVICE FOR CARRYING OUT SAID METHOD

(75) Inventors: Anatoly Leontievich Vikharev, Nizhny Novgorod (RU); Aleksey Mikhaylovich Gorbachev, Nizhny Novgorod (RU); Aleksandr Grigorievich Litvak, Nizhny Novgorod (RU); Juriy Vladmirovich Bykov, Nizhny Novgorod (RU); Grigory Gennadievich Denisov, Nizhny Novgorod (RU); Oleg Andreevich Ivanov, Nizhny Novgorod (RU); Vladimir Aleksandrovich Koldanov, Nizhny Novgorod (RU)

(73) Assignee: Institute of Applied Physics RAS, Nizhny Novgorod (RU)

( * ) Notice: Subject to any disclaimer, the term of this patent is extended or adjusted under 35 U.S.C. 154(b) by 1403 days.

(21) Appl. No.: 10/526,800
(22) PCT Filed: Sep. 18, 2003
(86) PCT No.: PCT/RU03/00410
§ 371 (c)(1), (2), (4) Date: Mar. 7, 2005

(87) PCT Pub. No.: WO2004/029325
PCT Pub. Date: Apr. 8, 2004

(65) Prior Publication Data
US 2006/0110546 A1    May 25, 2006

(30) Foreign Application Priority Data
Sep. 30, 2002    (RU)   ............................. 2002125807

(51) Int. Cl.
C23C 16/00    (2006.01)
C23F 1/00    (2006.01)
H01L 21/306    (2006.01)
(52) U.S. Cl. .................. 118/723 MW; 156/345.36; 156/345.41

(58) Field of Classification Search ......... 118/723 MW; 156/345.36, 345.41
See application file for complete search history.

(56) References Cited

U.S. PATENT DOCUMENTS
5,039,548 A    8/1991   Hirose et al.
(Continued)

FOREIGN PATENT DOCUMENTS
EP    0 520 832 A1    12/1992
(Continued)

OTHER PUBLICATIONS

Spitsyn B.V., Bouilov L.L., Derjaguin B.V., J. of Cryst. Growth, 1981, v.52, p. 219-226.
(Continued)

*Primary Examiner*—Parviz Hassanzadeh
*Assistant Examiner*—Rakesh Dhingra
(74) *Attorney, Agent, or Firm*—Ian C. McLeod (57) ABSTRACT

The invention relates to carbon deposition by decomposing gaseous compounds with the aid of the SHF discharge plasma and can be used, for example, for producing polycrystalline diamond films (plates), which are used for producing output windows of power SHF sources, for example gyrotrons. Said invention ensures a high speed deposition of the high quality diamond films (having a loss-tangent angle □ equal to or less than $3 \times 10^{-5}$ on supports whose diameter is equal to or higher than 100 mm. For this purpose, a SHF discharge is initiated in a gas mixture which is arranged in a reaction chamber and contains at least hydrogen and hydrocarbon. Afterwards, said gas mixture is activated by producing a stable nonequilibrium plasma with the aid of SHF radiation having a frequency f which is many times higher than a commonly used frequency of 2.45 GHz, for example 30 GHz. In order to localize the plasma, a standing wave is formed near the carrier and plasma layers are formed in the antinodes thereof in such a way that the sizes thereof are adjustable.

3 Claims, 8 Drawing Sheets

U.S. PATENT DOCUMENTS

| | | | |
|---|---|---|---|
| 5,310,426 A | * | 5/1994 | Mori .................... 118/723 AN |
| 5,311,103 A | | 5/1994 | Asmussen et al. |
| 5,518,759 A | * | 5/1996 | Sevillano et al. .............. 427/10 |
| 5,580,387 A | * | 12/1996 | Chen .................. 118/723 MW |
| 5,651,827 A | * | 7/1997 | Aoyama et al. ............. 118/725 |
| 5,819,684 A | * | 10/1998 | Hawkins et al. ............ 118/715 |
| 5,954,882 A | | 9/1999 | Wild et al. |
| 6,620,290 B2 | * | 9/2003 | Yamamoto et al. ..... 156/345.41 |

FOREIGN PATENT DOCUMENTS

| | | | |
|---|---|---|---|
| EP | 0520832 | B1 | 3/1996 |
| RU | 2099283 | C1 | 12/1997 |
| RU | 2171554 | C2 | 7/2001 |

OTHER PUBLICATIONS

P. K. Bachmann, in Handbook of industrial diamonds and diamond films, Eds. M. Prelas, G. Popovici, L. K. Bigelow, New York: Marcel Dekker Inc. USA, 1998, p. 821-850.

Goodwin D. G., Butler J. E., in Handbook of industrial diamonds and diamond films, Eds. M. Prelas, G. Popovici, L. K. Bigelow, New York: Marcel Dekker Inc. USA, 1998, p. 527-581.

Vikharev, A. L. et al., Sov. J. Plasma Phys., 1987, v.13, NQ9, pp. 648-652.

G. G. Denisov, S.V.Kuzikov, in Strong Microwaves in Plasmas, Ed. A. G. Litvak, N. Novgorod: IAP, 2000, v.2, p. 960-966.

A. M. Gorbachev et al, Numerical modeling of a microwaveplasma CVD reactor, Diamond and Related Materials 10 (2001) p. 342-346.

\* cited by examiner

HIGH VELOCITY METHOD FOR DEPOSING DIAMOND FILMS FROM A GASEOUS PHASE IN SHF DISCHARGE PLASMA AND DEVICE FOR CARRYING OUT SAID METHOD

CROSS-REFERENCE TO RELATED APPLICATIONS

The application claims priority to International application PCT/RU2003/000410 filed Sep. 18, 2003, which also claims priority to Russian Application No. 2002125807 filed Sep. 30, 2002.

STATEMENT REGARDING FEDERALLY SPONSORED RESEARCH OR DEVELOPMENT

Not Applicable

BACKGROUND OF THE INVENTION (1) Field of the Invention

Diamond films are deposited from the gaseous phase by means of the so-called CVD (chemical vapour deposition) method. This method is based on activation, by some means or other, of the gaseous mixture, which most often contains hydrogen and hydrocarbon, to produce required chemically active particles: atoms of hydrogen and carbon-containing radicals. Deposition of these radicals on a substrate forms a polycrystalline diamond films as the result of a whole set of surface reactions with efficient growth of diamond films being possible only when the density of atomic hydrogen near the substrate surface is non-equilibrium (Spitsyn B. V., Bouilov L. L., Derjaguin B. V., J. of Cryst. Growth, 1981, v. 52, p. 219-226).

Several ways for activation of gas media are known: using hot-filament or gas-discharge plasma produced by direct-current discharges, or high-frequency, microwave or arc discharges. CVD reactors that are used for commercial applications employ plasma produced by means of a microwave discharge; they are so-called MPACVD (microwave plasma-assisted chemical vapour deposition) reactors. This commercial application is associated with the fact that microwave discharges create high density of excited and charged particles, and, since they are electrode-free, make it possible to grow quality diamond films ("white diamond") at the rates higher than 1 ~m/h.

For example, there is a way to deposit diamond films from the gaseous phase in the microwave discharge plasma, which is based on ignition of a microwave discharge in the gaseous mixture that contains at least hydrogen and hydrocarbon; the frequency of the microwave radiation used to ignite the discharge is 2.45 GHz, and the pressure of the gas mixture is maintained between 50 and 200 Torr. The said gas mixture is activated by the plasma of the microwave discharge. The diffusive transfer provided for the chemically active particles (radicals), which are produced (e.g. methyl <iJH3, acetylene C2H2, and hydrogen atoms H), moves them from the plasma volulile to the substrate, which is specially prepared to create centres of crystallization (nucleation). The substrate temperature is maintained within the range of T s:=700-1100° C., and the surface reactions with participation of carbon-containing radicals that run on the substrate surface provide the growth of the diamond film (P. K. Bachmann, in Handbook of industrial diamonds and diamond films, Eds. M. Prelas, G. Popovici, L. K. Bigelow, New York: Marcel Dekker Inc. USA, 1998, p. 821-850). A drawback of this method of diamond film deposition is the low rate (1-2 µm/h), at which quality diamond films with their thermal conductivity at least 10 W/cm K grow.

A higher rate of diamond film growth (3-9 µm/h) with the same quality is provided by the high-speed method of diamond film deposition from the gaseous phase in microwave discharge plasma, which is described in U.S. Pat. No. 5,518,759, Int. Cl. C23C16/50, B05D3/06, dated 1996. The basis of the prototype method is that the microwave discharge is ignited in the gas mixture, which fills the reaction chamber and contains at least hydrogen and hydrocarbon, with the pressure from 50 through 200 Torr provided. The said gas mixture is activated by the plasma of the microwave discharge at the frequency of f=2.45 GHz to produce atoms of hydrogen and carbon-containing radicals, which are deposited on the substrate and, as the result of surface reactions, provide formation of a polycrystalline film. The gas mixture is activated under the conditions, when the thermal equilibrium mechanisms of the birth of carbon-containing radicals are dominant over the non-equilibrium electron mechanisms. These conditions are characterized by a higher relative density of radical C2 (molecular carbon) in the plasma and are achieved by means of increasing (up to 5 kW/cm2) the microwave power injected into the plasma reactor per a unit of the area of the deposited film.

A drawback of this prototype method for deposition of diamond films is the necessity to use a microwave generator that produces very high power (up to 3 MW) for deposition of large area films.

Known devices for deposition of diamond films from the gaseous phase in the microwave discharge plasma are the plasma reactors of the resonance type based on the cylindrical resonator excited at the frequency of 2.45 GHz or 915 MHz. This class is represented by the device described in U.S. Pat. No. 5,311,103, Int. Cl. H01J7/24, dated 1994. This device consists of a reaction chamber with a substrate and a substrate holder, a cylindrical resonator that houses the reaction chamber made as a quartz dome, a transmitting coaxial waveguide line with coupling elements to inject the microwave power in the $TM_{oln}$ mode into the resonator, and an adjustment device to move the sliding short of the cylindrical resonator and tune the resonator in resonance. The pressure in the reaction chamber is maintained in the range between 50 and 200 Torr, and the plasma is generated over the substrate in the form of a hemisphere with its diameter along the substrate not exceeding a half-length of the microwave. A drawback of this device is that the small diameter of the plasma in the reaction chamber sets limitations to the diameter of the diamond films deposited homogeneously (60-70 mm), when the microwave radiation with its frequency 2.45 GHz (wavelength 12.2 cm) is used.

Homogeneous diamond films with somewhat larger areas are deposited in the microwave discharge plasma at the frequency of 2.45 GHz in the device described in U.S. Pat. No. 5,954,882, Int. Cl. C23C16/00, dated 1999. It consists of a reaction chamber with a substrate and a substrate holder, and an ellipsoid resonator; the reaction chamber made as a quartz dome is situated in one of the focal regions of the ellipsoid. The resonator is equipped with a transmitting coaxial waveguide line with coupling elements to inject the microwave power into the resonator via the other focal region of the ellipsoid. The pressure of the gas mixture in the reaction chamber is maintained in the range from 50 to 200 Torr. Since the dimensions of the ellipsoidal resonator are significant as compared with the length of the microwaves and the conditions for propagation of the microwaves in the resonator are nearly quasi-optical, the distribution of the electric field in the focal region of the resonator becomes broadened. As the result, the plasma produced in the reaction chamber over the substrate makes it possible to deposit homogeneous diamond films with their diameters 70-80 mm.

Nearly the same is the area of the films deposited in the device chosen as the prototype and described in the EP Patent 0520832, B1, Int. Cl. C23C16/26, C23C16/50, H01Q19/00, dated 1992, that employs quasi-optical conditions of propagation of microwaves with their frequency 2.45 GHz to inject them into the reaction chamber.

This device consists of a reaction chamber made as a dome with a window for injection of microwave radiation, a microwave generator operating at the frequency of 2.45 GHz, a transmission line that consists of a radiating horn and a reflector, and a metal mirror or a dielectric lens that forms a converging wave beam injected into the reaction chamber through the window. The substrate with the substrate holder are situated in the reaction chamber, in which the required pressure of the gas mixture is maintained by means of the system for gas pump-in and pump-out. The microwave discharge is ignited in the focal region of the beam over the substrate. In the prototype plasma reactor, the stable plasma was maintained over the substrate at the fixed pressure of the gas mixture equal to 40 Torr.

A drawback of the prototype device is that it employs a converging wave beam to create the plasma over the substrate. It is known that in the converging beam the boundary of the microwave discharge, which is initially ignited in the region of the maximum field intensity, propagates opposite to the microwave radiation as the ionization front (Yu. P. Raizer, Laser sparks and discharge propagation, Moscow, Nauka, 1974). This dynamics of the discharge leads to removal of the energy release region away from the substrate. In the prototype reactor, stationary maintenance of the plasma over the substrate is possible only in narrow ranges of the gas pressure and the values of the incident microwave power in the beam. As the result, it is impossible to achieve high specific energy contributions into the plasma near the substrate, i.e. it is impossible to obtain high densities of active radicals and, hence, it is impossible to achieve high rates of diamond film growth (in the prototype, the growth rate is 1 µm/h).

DISCLOSURE OF THE INVENTION

The problem to be solved by this invention is the development of a high-speed method to deposit diamond films from the gaseous phase in the microwave discharge plasma, which makes it possible to produce quality diamond films (with their tangent of losses, $\delta$, below $3\times10^{-5}$ and thermal conductivity in the range from 10 through 20 W/cm K) on substrates over 100 mm in diameter, and the development of a device (plasma reactor) to realize this method.

In the framework of the method developed, the technical result is achieved by the following: the developed high-speed method for deposition of diamond films from the gaseous phase in the microwave discharge plasma, as well as the prototype method, includes ignition of the microwave discharge in the gas mixture that fills the reaction chamber and contains at least hydrogen and hydrocarbon and activation of the said gas mixture by the plasma of the microwave discharge to produce atoms of hydrogen and carbon-containing radicals, which are deposited on the substrate and provide formation of the diamond film as the result of surface reaction.

The novelty of the method developed is that the said gas mixture is activated by means of increasing the density of electrons in the plasma, $N_e$, at the cost of creating of stable non-equilibrium plasma in the reaction chamber using the microwave radiation with its power being least 1 kW and its frequency f being much higher than 2.45 GHz, which is used conventionally, and in order to localize the plasma in the vicinity of the substrate, a standing wave is formed, in the antinodes of which wave the plasma layers are generated and maintained with the possibility to control their dimensions.

It is expedient to activate the said gas mixture by means of increasing electron density using the electromagnetic radiation with its frequency f equal to 30 GHz, and to control the dimensions of the plasma layers in the antinodes of the standing microwave by varying the shape and size of the transverse cross-section of the converging wave beams that form the standing wave.

In one specific case, in order to form the standing wave it is expedient to use four and more converging wave beams crossing pair-wise.

In the second specific case, in order to form the standing wave it is expedient to use two converging crossing wave beams.

In the third specific case, in order to form the standing wave it is expedient to use two converging wave beams directed opposite to each other.

In the fourth specific case, in order to form the standing wave it is expedient to use the converging wave beam incident on the substrate and the wave beam reflected from the substrate.

The technical result in the device developed is achieved by the following: the developed plasma reactor for high-speed deposition of the diamond film from the gaseous phase in the microwave discharge plasma, as well as the prototype reactor, contains the microwave generator, the transmission line ending with the quasi-optical electrodynamic system, the reaction chamber with the substrate fixed on the substrate holder within, and the system for pump-in and pump-out of the selected gas mixture.

The novelty of the device developed is that the quasi-optical electrodynamic system is made and installed in such a way as to make it possible to form a standing microwave in a preset region near the substrate, and the transmission line is made as an oversized circular waveguide with a corrugated inner surface, which is supplemented with a system of mirrors in order to transmit at least one Gaussian beam to the said quasi-optical electrodynamic system.

In one specific case of manufacturing the plasma reactor, it is expedient to make the quasi-optical electrodynamic system as four mirrors situated on different sides relative to the region of plasma formation and installed in such a way as to make it possible to direct the microwave radiation as four wave beams crossing pair-wise, and it is expedient to install the quasi-optical electrodynamic system in the reaction chamber and supplement the transmission line with a divider, which would divide one wave beam into four beams and should be installed at the output of the said oversized circular waveguide.

In the second specific case, it is expedient to make the quasi-optical electrodynamic system as two mirrors situated on different sides relative to the region of plasma formation and installed in such as a way as to make it possible to direct two microwave beams at low angles to the substrate surface, and it is expedient to supplement the transmission line with a divider, which would divide one wave beam into two beams and should be installed at the output of the said oversized circular waveguide.

In the third specific case, it is expedient to make the quasi-optical electrodynamic system as two mirrors situated on different sides relative to the region of plasma formation and installed in such a way as to make it possible to direct wave beams opposite to each other, and it is expedient to install one of the mirrors in such a way as to make it movable forward and backward parallel to itself to the distance ±λ/4, where λ is the wavelength of the microwave radiation, and it is necessary to supplement the transmission line with a divider, which would divide one wave beam into two beams and should be installed at the output of the said oversized circular waveguide.

In the fourth specific case of manufacturing the plasma reactor, it is possible to set a dielectric window for injection of the microwave radiation in the lower part of the reaction chamber, and it is expedient to install the substrate opposite to the window in the upper part of the chamber, and in this case it is necessary to make the quasi-optical electrodynamic system as one mirror installed out of and lower than the said reaction chamber in such a way as to make it possible to direct the microwave radiation beam upwards perpendicular to the substrate surface.

In the fifth specific case of manufacturing the plasma reactor, the quasi-optical electrodynamic system can be made as one mirror installed in such a way as to make it possible to direct the beam of the microwave radiation with the normal incidence on the substrate surface or at a low angle to the normal, and it is possible to add a radioparent cooled wall, which is made as a grating of thin metal cooled tubes or rods and set parallel to the substrate at the distance over λ/2 from it, into the reaction chamber.

In the sixth specific case of manufacturing the plasma reactor, it is expedient to make the quasi-optical electrodynamic system as a mirror and a quasi-optical resonator with plane-parallel mirrors set at the distance being a multiple of λ/2, which is optically coupled with the aforesaid mirror, and in this case one of the resonator mirrors is the substrate on its holder, and the other mirror can be made as a periodical grating of thin metal tubes or rods, and the periods of that grating is less than λ.

In the seventh specific case of manufacturing the plasma reactor, the system for pump-in of the gas mixture into the region of plasma formation in the reaction chamber can be made as a metal concave screen with a feed-in tube in its central part, which screen is set over the substrate holder at a controllable distance, and the system for gas pump-in can be made as a set of apertures in the substrate holder, which is equipped with a volume for pump-out of the gas mixture, in which volume a system for water cooling of the upper part of the substrate holder is situated.

In the eighth specific case of manufacturing the plasma reactor, it is expedient to combine the system for pump-in of the gas mixture selected with a grating of thin cooled metal tubes, and the system for gas pump-out can be made as a set of apertures in the substrate holder, which is equipped with a volume for the pumped-out gas mixture, in which volume a system for water cooling of the upper part of the substrate holder is situated.

The technical result, specifically, the increase in the rate of diamond film deposition from the gaseous phase in the microwave discharge plasma while retaining good quality of the film, in the method and device developed is achieved due to the fact that, as found by the authors, when the frequency of the microwave field increases, the density of electrons, Ne, also increases, which makes it possible to raise the rate of gas mixture activation, i.e. the rate of formation of atomic hydrogen and other chemically active radicals, which, in its turn, results in a faster rate of diamond film deposition. In this case, the increase in the frequency of the microwave field and the use of the quasi-optical approach makes it possible to control the dimensions of the homogeneous plasma over the substrate, which, in its turn, provides homogeneity of the deposited film across a wide area.

The effect of a higher microwave frequency on the rate of diamond film deposition in an MPACVD reactor can be explained as follows:

In MPACAVD reactors the rate of diamond film growth is determined by the value of the density of carbon-containing radicals and hydrogen atoms near the substrate (Goodwin D. G., Butler J. E., in Handbook of industrial diamonds and diamond films, Eds. M. Prelas, G. Popovici, L. K. Bigelow, New York: Marcel Dekker Inc. USA, 1998, p. 527-581). In the majority of the existing MPACAVD reactors, the main channel for dissociation of hydrogen molecules is the electron impact dissociation, even at high (Tg ~3000-3500 K) temperatures of the gas (Mankelevich Yu. A., Rakhimov A. T., Suetin N. V., Sov. J. Plasma Phys., 1995, v. 21, No. 10, pp. 921-927). Therefore, the degree of dissociation of hydrogen molecules depends on the value of electron density, Ne, in the plasma. The value of Ne in the plasma maintained by the microwave field in the resonance-type reactors grows up to the point, at which the nonlinear effect of electromagnetic field skinning starts manifesting itself. Hence, the characteristic size of the plasma over the substrate in the reactor equals approximately to the depth of the skin-layer, δ. In the case of the parameters used traditionally in MPACVD reactors, (gas temperature Tg ~3000-3500 K depending on the specific power absorbed in the plasma, and the initial gas pressure 50-200 Torr), the gas density near the substrate corresponds to the minimum of the Pashen curve for maintenance of a continuous microwave discharge (Vikharev, A. L. et al., Sov. J. Plasma Phys., 1987, v. 13, NQ9, pp. 648-652), at which the rate of electron collisions, Y, is of the order of magnitude of the circular field frequency, ω. Under these conditions, the depth of the skin-layer, δ, equals approximately $$\delta \approx 2(c/\omega)(N_{co}/N_e)[(\omega^2+v^2)/\omega v],$$

where $Nco=m\omega^2/4\pi e^2$ is critical density, $\omega=2\pi f$ is circular frequency of the field, v is rate of collision of electrons with neutral particles, and m and e are mass and charge of electrons, respectively. When the depth of the skin-layer is fixed (e.g. for the resonance-type reactors this value is of the order of 1 cm), $\delta=\delta_0$, from the above correlation for δ we obtain that the value of the electron density, Ne, in plasma is proportional to the frequency of microwave radiation:

$$N_e \infty Nco(c/\delta_0\omega)[(\omega^2+v^2)/\omega v] \infty \omega.$$

Therefore, the value of electron density, Ne, and, correspondingly, the degree of dissociation of molecular hydrogen in the non-equilibrium plasma of the MPACVD reactor grows with the increase of the microwave radiation frequency.

An additional technical result, namely, a larger area of the deposited diamond films while its homogeneity is retained, is provided by the developed design of the plasma reactor, in which pair-wise crossing wave beams are formed, e.g. four coherent beams crossing pair-wise.

BRIEF DESCRIPTION OF THE PREFERRED EMBODIMENTS

Figure 1:
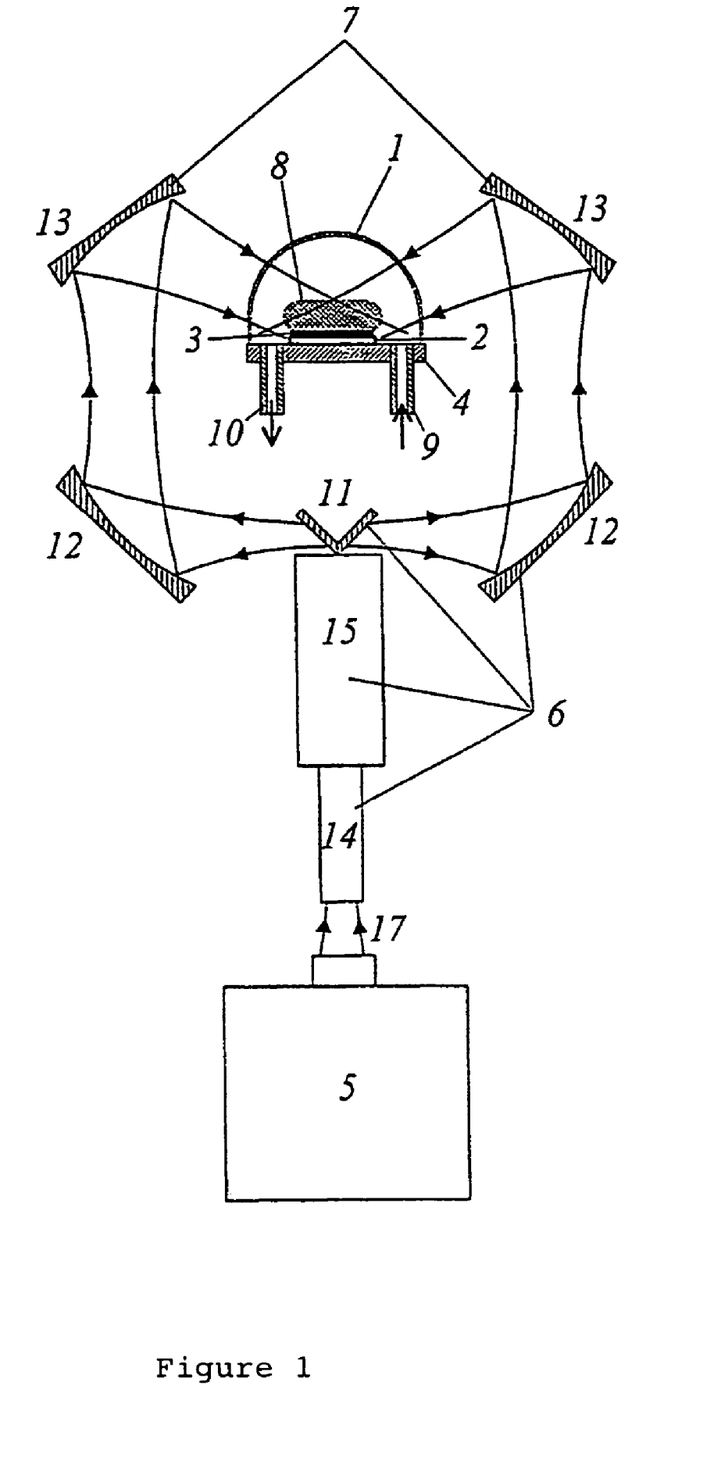
FIG. 1 shows the schematic profile of the block-diagram of the developed plasma reactor that realizes the method developed.

The design of the reactor shown in FIG. 1 contains the reaction chamber 1 with the substrate 2 for deposition of the diamond film 3 installed in it. The substrate 2 is situated on the substrate holder 4. Microwave radiation if produced by the microwave generator 5 connected with the transmission line 6, which ends with the quasi-optical electrodynamic system 7. The quasi-optical electrodynamic system 7 consists of several metal mirrors set in such a way as to make it possible to form a standing microwave in the region of plasma formation 8 near the substrate 2. The reaction chamber 1 is equipped with the system for gas mixture pump-in 9 and the system for gas pump-out 10, so as to maintain the required pressure and velocity of the flow of the working gas mixture in the chamber 1. The reaction chamber can be, as in the prototype device, a transparent quartz tube. A gyrotron can be used as the radiation source 5.

Figure 2:
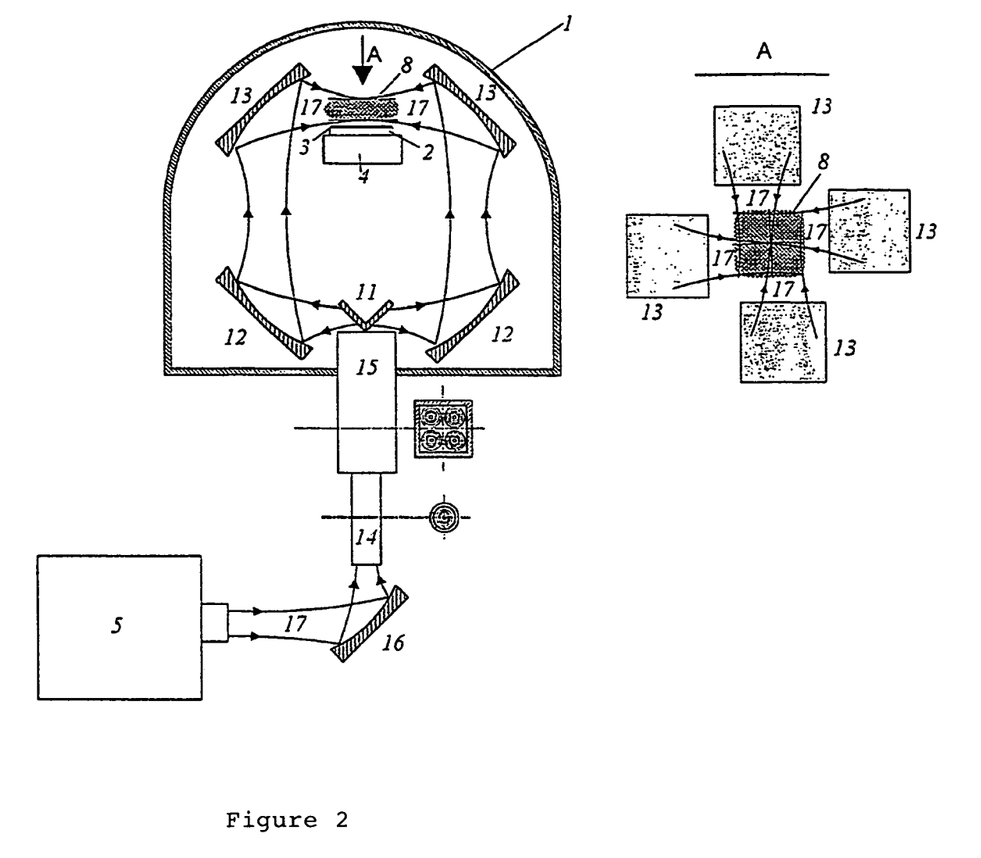
FIG. 2 shows the profile of the plasma reactor with the quasi-optical electrodynamic system that provides formation of a plasma layer near the substrate in the region of crossing of four wave beams.

In the first specific case of manufacturing the plasma reactor, which is shown in FIG. 2, the transmission line 6 consists of the oversized waveguide with the circular transverse cross-section 14 that is equipped with the divider 15 of the wave beam, which divider is coupled optically with the set of plane mirrors 11, each of which mirrors, in its turn, is coupled optically with one concave metal mirror of the set of four mirrors 12. The quasi-optical electrodynamic system 7 consists of four concave metal mirrors 13. The internal surface of the waveguide 14 of the transmission line 6 is corrugated. One end of the waveguide 14 is coupled optically with the microwave generator 5, and the other end is connected with the divider 15 of the wave beam into four beams. The divider 15 is made as an oversized square waveguide, and its operation is based on the effect of image multiplication during propagation of an electromagnetic wave (G. G. Denisov, S. V. Kuzikov, in Strong Microwaves in Plasmas, Ed. A. G. Litvak, N. Novgorod: IAP, 2000, v. 2, p. 960-966). The mirrors 11, 12, and 13 can be situated both in the reaction chamber 1 (as shown in FIG. 2) and out of the reaction chamber 1 (as shown in FIG. 1). The output of the microwave generator 5 can be coupled optically directly with the circular waveguide 14 (as shown in FIG. 1), or coupled optically with it by means of the additional mirror 16. The mirrors 13 that form the quasi-optical electrodynamic system 7 are set in such a way as to make it possible to direct the microwave radiation 17 as four wave beams crossing pair-wise to the region 8 of plasma formation near the substrate 2 (see view A in FIG. 2).

Figure 7:
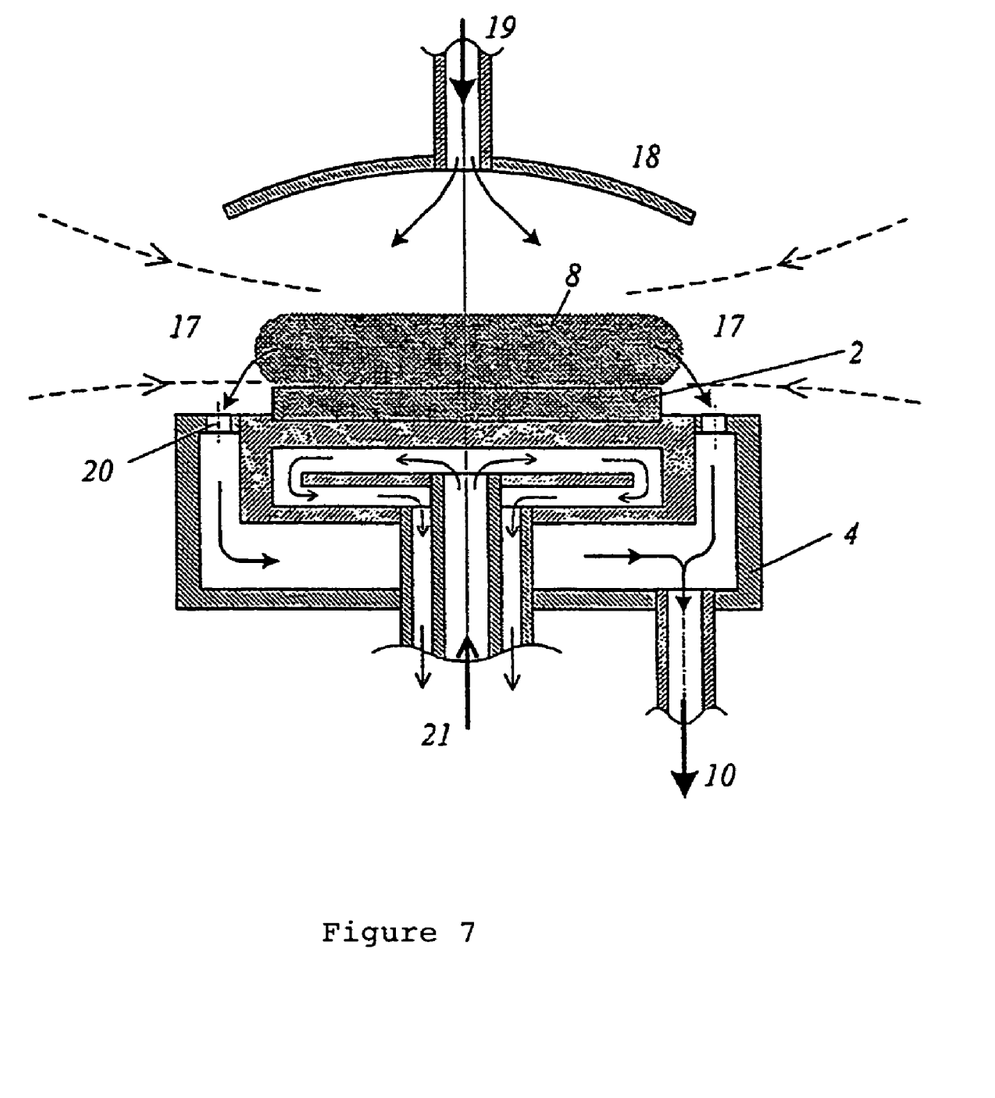
FIG. 7 shows the profile of the substrate holder with the cooling system and the systems for gas pump-in and pump-out for the plasma reactors described in Paragraphs 8, 9, and 10 of the Invention Formula.

The system for pump-in 9 of the gas mixture containing at least hydrogen and hydrocarbon into the reaction chamber 1 and the system for gas pump-out 10 that maintain the required pressure of the working mixture can be made in different ways, e.g. as shown in FIG. 7. The pump-in system 9 is made as the concave metal screen 18 with the feed-in pipe 19 in its central part. The gas pump-out system 10 is made as the set of apertures 20 in the holder 4 of the substrate 2, in which case the holder 4 is equipped with a volume for the pumped-out gas mixture, in which the water-cooling system 21 is situated that cools that part of the holder 4, which contacts the substrate 2.

Figure 3:
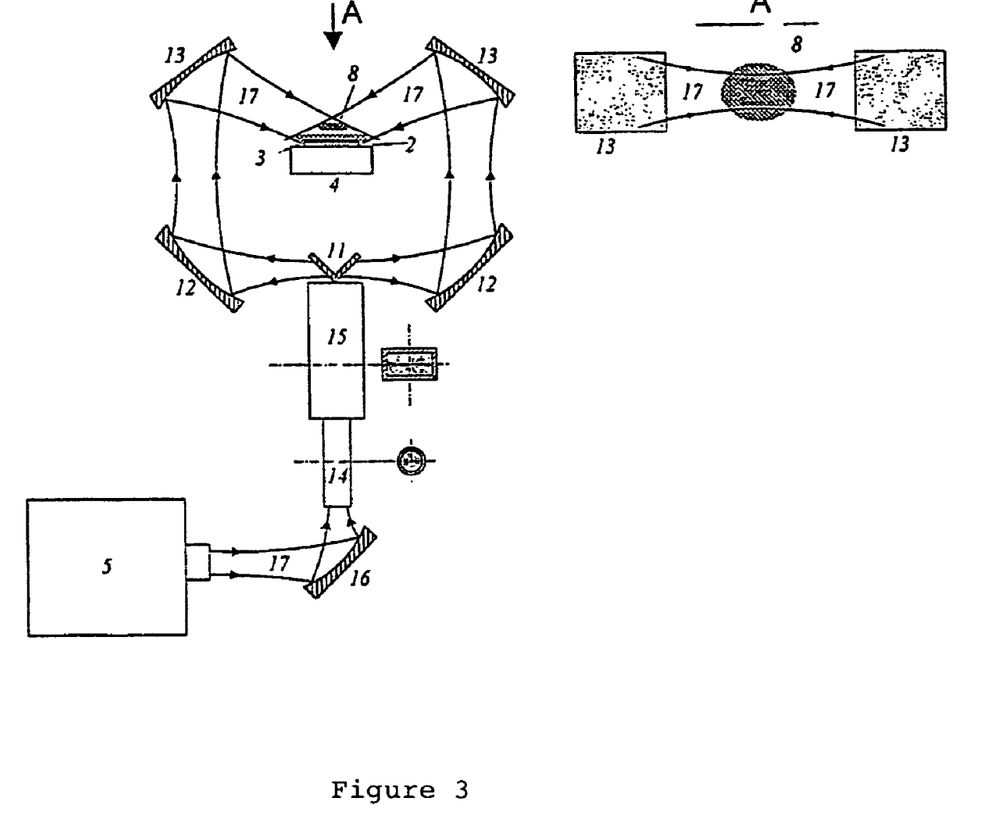
FIG. 3 shows the profile of the block-diagram of the plasma reactor with the quasi-optical electrodynamic system that provides formation of a plasma layer near the substrate in two crossing wave beams.

In the second specific case of manufacturing the plasma reactor shown in FIG. 3, the transmission line 6, as in the previous case, is a circular waveguide 14 that is equipped with the divider 15 of the wave beam, which is coupled optically with two plane metal mirrors 11, each of which mirrors, in its turn, is coupled optically with one concave metal mirror of the set of two mirrors 12. The quasi-optical electrodynamic system 7 consists of two concave metal mirrors 13. In this case, the internal surface of the waveguide 14 is corrugated. In this specific case of manufacturing the plasma reactor, the divider 15 of the wave beam into two beams is made as an oversized rectangular waveguide, the operation of which is based on the effect of image multiplication during propagation of an electromagnetic wave. The mirrors 11, 12, and 13 can be situated both in the reaction chamber 1 (as shown in FIG. 2), and out of the reaction chamber (as shown in FIG. 1). The two mirrors 13 that form the quasi-optical electrodynamic system 7 are set in such a way as to make it possible to direct the radiation as two crossing wave beams into the region 8 of plasma formation near the substrate 2 (see view A in FIG. 3). The system for gas pump-in 9 into the reaction chamber 1 and the system for gas pump-out 10 are made in the same way as in the previous specific case, as shown in FIG. 7.

Figure 4:
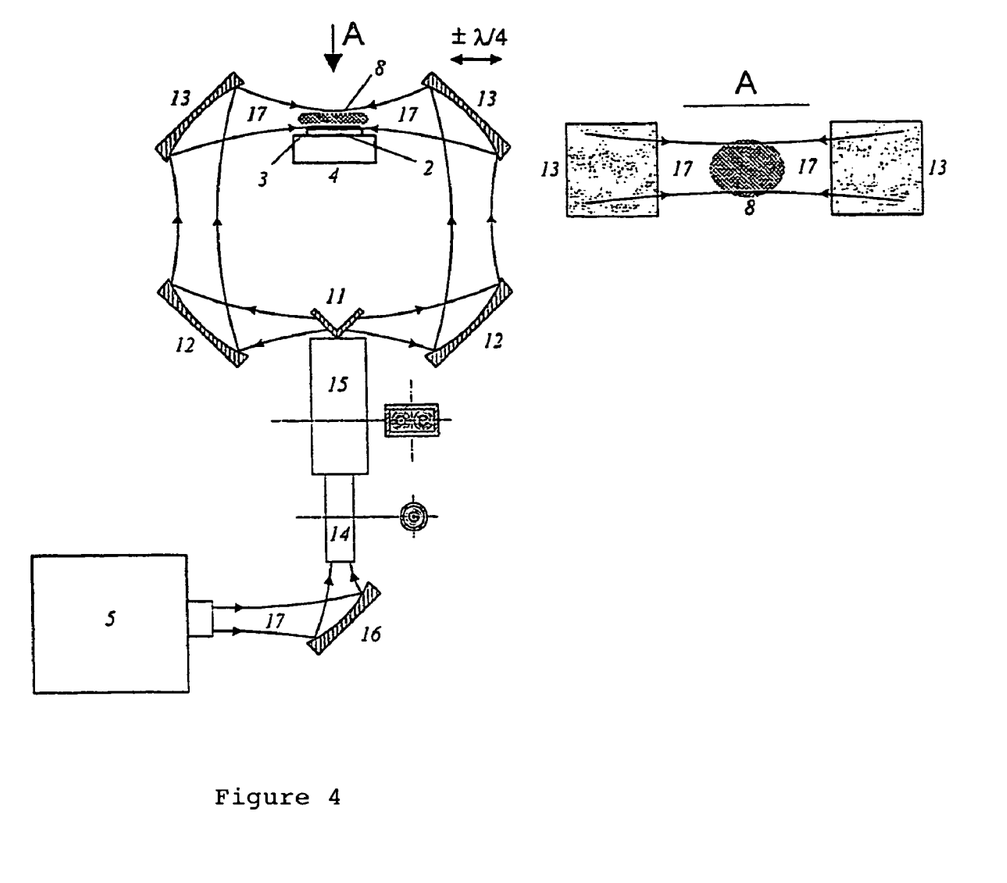
FIG. 4 shows the profile of the block-diagram of the plasma reactor with the quasi-optical electrodynamic system that provides formation of a plasma layer near the substrate in two opposite wave beams.

In the third specific case of manufacturing the plasma reactor shown in FIG. 4, the transmission line 6 consists, as in the previous cases, of the oversized circular waveguide 14 equipped with the divider 15 of the wave beam, which is coupled optically with the set of two plane mirrors 11, each of which mirrors, in its turn, is coupled optically with one concave metal mirror of the set of two mirrors 12. The quasi-optical electrodynamic system 7 consists of two concave metal mirrors 13, which are set in such a way as to make it possible to direct the radiation 17 as two opposite wave beams to the region 8 of plasma formation near the substrate 2 (see view A in FIG. 4). To provide homogeneity of deposition of the diamond film 3 on the substrate 2, one of the mirrors 13 is set in such a way as to provide the possibility of moving it forward and backward parallel to itself to the distance of $\pm\lambda/4$, where $\lambda$ is the wavelength of the microwave radiation. The mirrors 11, 12, and 13, as in the previous specific case, can be situated both in the reaction chamber 1, and out of it.

Figure 5:
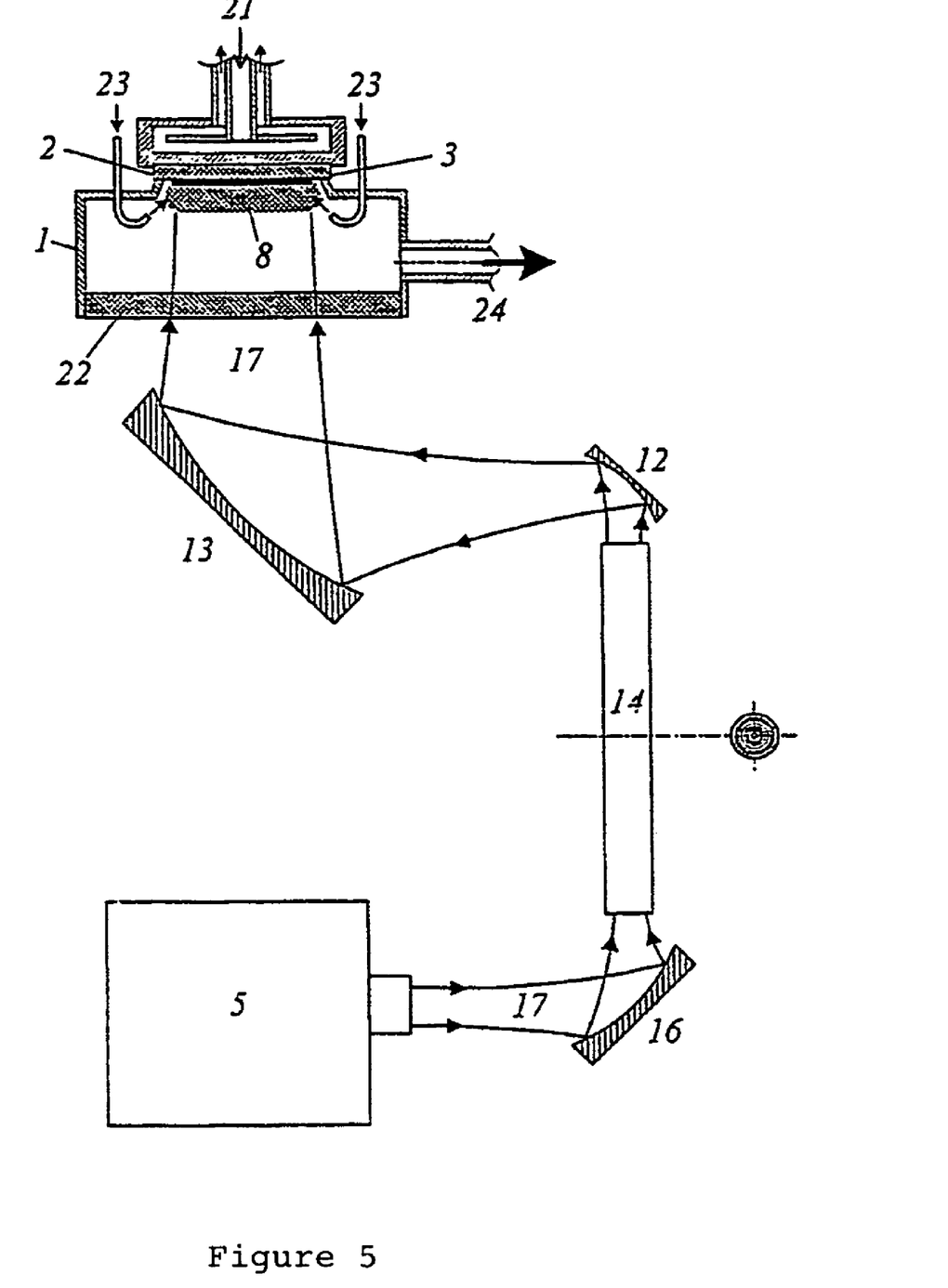
FIG. 5 shows the profile of the block-diagram with the quasi-optical electrodynamic system that provides formation of a plasma layer near the substrate in the reflected wave beam.

In the fourth specific case of manufacturing the plasma reactor shown in FIG. 5, the reaction chamber 1 is situated vertically and its lower part is equipped with the dielectric window 22 for injection of the microwave radiation 17, in which case the substrate 2 on the holder 4 is set in the upper part of the chamber 1. In this case, the quasi-optical electrodynamic system 7 is made as one mirror 13 situated on the outside of and lower than the chamber 1 and set in such a way as to make it possible to direct the beam of the microwave radiation 17 upwards perpendicularly to the surface of the substrate 2. The system 9 for gas-mixture pump-in into the reaction chamber 1 is made, in this case, as several tubes 23. To maintain the required pressure of the working mixture, the tube 24 is used as the gas pump-out system 10. The temperature regime of the substrate 2 is provided by the water-cooling system 21, as in the previous specific cases.

Figure 6:
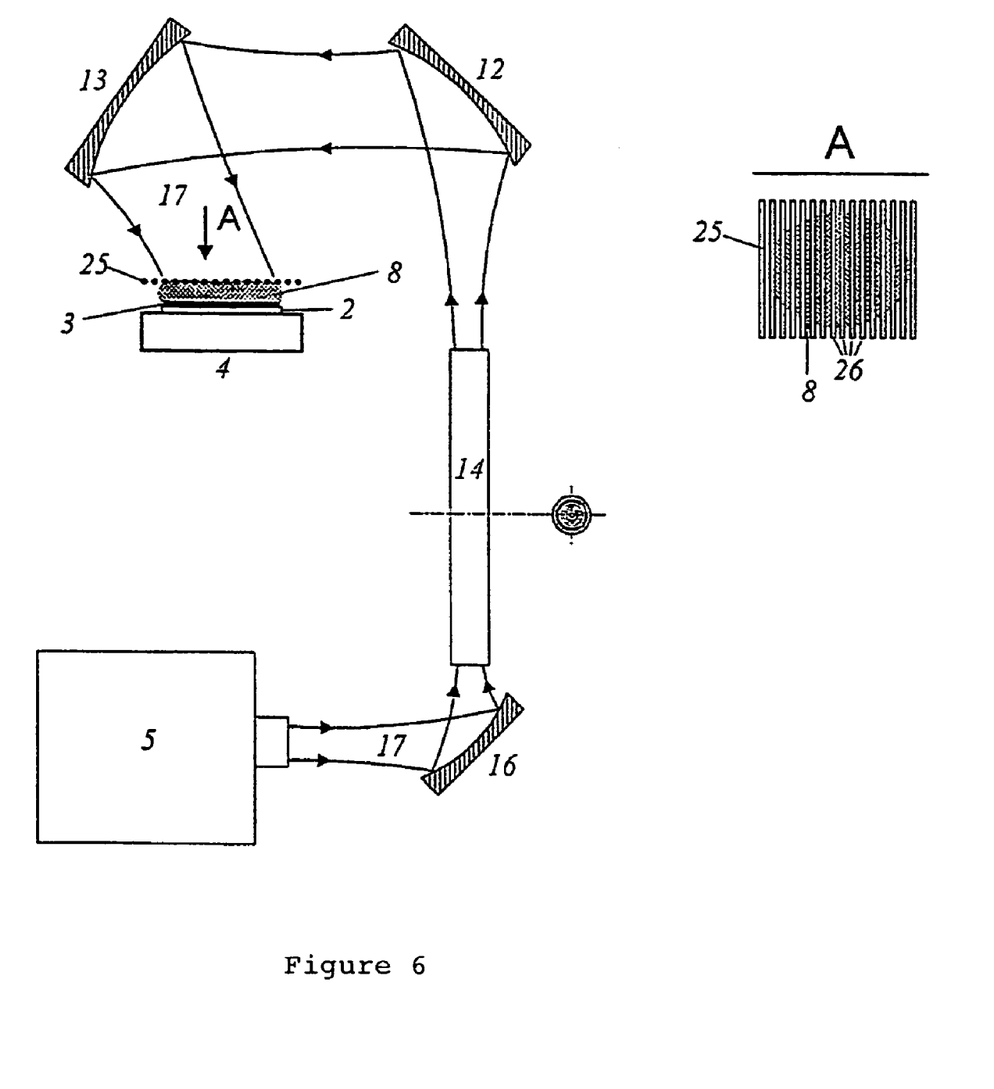
FIG. 6 shows the profile of the block-diagram with the quasi-optical electrodynamic system with a microwave-transparent periodic grating.
Figure 8:
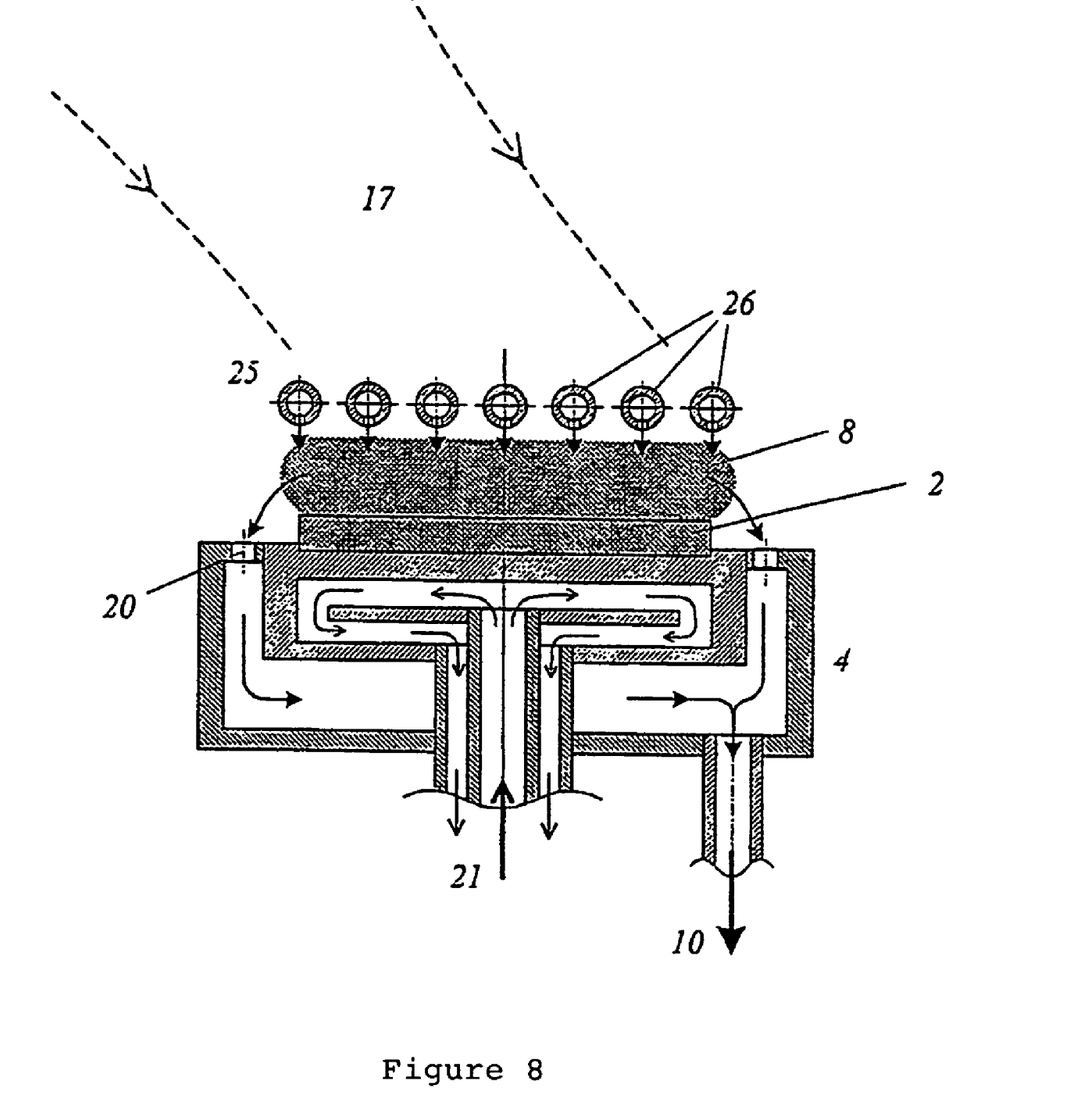
FIG. 8 shows the substrate holder with the cooling system and the systems for gas pump-in and pump-out for the plasma reactor described in Paragraphs 12 and 13 of the Invention Formula.

In the fifth specific case of manufacturing the plasma reactor shown in FIG. 6, the transmission line 6 consists of the oversized circular waveguide 14, the output of which waveguide is coupled optically with the quasi-optical electrodynamic system 7 by means of the concave metal mirror 12, and the quasi-optical electrodynamic system 7, in this case, is made as one concave metal mirror 13 set in such a way as to make it possible to direct the microwave beam 17 with the normal direction of its incidence on the surface of the substrate 2 or at a low incidence angle. In this case, a radioparent cooled wall made as a periodic grating 25 of thin cooled metal tubes or rods 26 is introduced into the reaction chamber 1 and installed parallel to the substrate 2 at the distance from the substrate over $\lambda/2$. The systems for gas mixture pump-in and pump-out in this case are shown in FIG. 8. The pump-in system 9 consists of cooled hollow tubes 26 of the periodic grating 25. In order to maintain the required pressure in the reaction chamber 1 in the range between 50 and 300 Torr, the gas pump-out system 10 is made as a set of apertures 20 in the holder 4 of the substrate 2. The temperature regime of the substrate 2 is provided by means of the water-cooling system 21.

In the sixth specific case of manufacturing the plasma reactor also shown in FIG. 6, the transmission line 6 and the quasi-optical electrodynamic system 7 are made identically to the previous case. The grating 25 introduced into the reaction chamber 1 and, in this specific manufacturing case, situated at the distance being a multiple of $\lambda/2$ from the substrate 2 form, together with the substrate 2, a quasi-optical resonator with plane-parallel mirrors that has the resonance at the frequency of radiation of the microwave generator 5.

The systems for gas mixture pump-in 9 and gas pump-out 10 are made in this design version identically to the previous specific case, as shown in FIG. 8.

In the concrete example of realization of the method and device (plasma reactor) developed, a quartz tube produced by Dzerzhinsky Glass Factory (Gus-Khrustalny, Russia) was used as the reaction chamber 1. The microwave generator 5 was a gyrotron generating microwave radiation with its frequency 30 GHz and power up to 10 kW manufactured by GYCOM Ltd. (Nizhny Novgorod, Russia). The circular oversized waveguide 14 with a corrugated internal surface equipped with the wave beam divider 15, which were manufactured at IAP RAS, Nizhny Novgorod. The design of the plasma reactor with the quasi-optical resonator used to realize the method proposed is shown in FIG. 6.

The developed high-speed method for deposition of diamond films from the gaseous phase in the microwave discharge plasma is realized as follows (see FIG. 1).

The linearly polarized microwave radiation 17 with its transverse intensity distribution in the form of the Gaussian distribution, which is produced by the microwave generator 5 at the frequency f that is much higher than the frequency of 2.45 GHz used traditionally (e.g. 30 GHz), is sent to the input of the transmission line 6. From the output of the transmission line 6 it is sent to the quasi-optical electrodynamic system 7, by means of which system the radiation 17 is sent to the reaction chamber 1 that contains at least hydrogen and hydrocarbon. The quasi-optical electrodynamic system 7 is used to form a standing microwave in the chosen region 8. At the antinodes of that wave plasma, layers are generated and maintained, i.e. the stable non-equilibrium plasma is obtained. Due to the use of the microwave radiation with its frequency f much higher than 2.45 GHz used traditionally, the plasma produced in the region 8 has higher electron density, forms higher density of carbon-containing radicals and atomic hydrogen, thus providing a rate of diamond film growth, which is higher than that in the prototype method, which uses the radiation with its frequency 2.45 GHz. Higher frequency f makes it possible also to use the methods of quasi-optics and control the dimensions of the homogeneous plasma over the substrate 2, which, in its turn, provides homogeneity of the deposited film, i.e. provides the solution for the task set.

The plasma reactor shown in FIG. 2 and making it possible to realize the method according to Paragraph 3 operates as follows.

The linearly polarized microwave radiation 17 with its frequency 30 GHz and the Gaussian transverse distribution of its intensity is directed, by means of the mirror 16, from the microwave generator 5 to the input of the oversized circular waveguide 14 with its internal surface corrugated. Due to this making of the waveguide 14 the transverse distribution of intensity of the radiation 17 at the output of the waveguide 14 is retained close to the Gaussian one. The Gaussian beam enters the input of the wave beam divider 15 and is divided, due to the effect of image multiplication during propagation of an electromagnetic wave in an oversized square waveguide, into four equal Gaussian beams with lower intensities. Each of these radiation beams 17 is directed to the quasi-optical electrodynamic system 7 by means of the sets of the mirrors 11 and 12 of the transmission line 6. The four concave mirrors 13 of the electrodynamic system 7 direct the four converging beams 17 to the region 8, where the said four beams cross pair-wise, as shown in FIG. 2 (view A), and a standing wave is formed in the region of their crossing. Due to a displacement of the mirrors 13 in each pair set opposite to each other within the plane perpendicular to the drawing plane (see view A in FIG. 2) relative to the symmetry axis for each pair of the mirrors 13, in this specific case the region 8, in which the standing wave is formed over the substrate 2, has a larger area (over 100 mm) as compared with other known methods. In the antinodes of the standing wave, the value of the electric field is equal or over the threshold field required to maintain the stationary plasma, hence, in the region 8 of the standing wave formation a microwave discharge is ignited and the plasma layer is created and localized. By changing the shape and dimensions of the transverse cross-section of the crossing wave beams 17, one can control the dimensions and shape of the plasma layer. The design of the plasma reactor according to Paragraph 8 of the Invention Formula, provides a more homogeneous supply of the microwave radiation to the plasma, as well as larger areas of the deposited diamond films.

The plasma reactor shown in FIG. 3 and realizing the method described in Paragraph 4 operates as follows.

The linearly polarized microwave radiation 17 with its frequency 30 GHz and with the transverse distribution of its intensity corresponding to the Gaussian distribution is directed, from the microwave generator 5, to the input of the divider 5, which in this specific case is made as an oversized rectangular waveguide, by means of the mirror 16 and the oversized circular waveguide 14. Due to the effect of image multiplication during propagation of electromagnetic radiation in the oversized rectangular waveguide 15, the Gaussian beam 17 is divided into two equal Gaussian beams 17 with lower intensities. Each of these radiation beams 17 is directed to the quasi-optical electrodynamic system 7 by means of the mirror sets 11 and 12. The concave mirrors 13 of the quasi-optical electrodynamic system 7 direct each of the said two beams 17 as a converging beam to the substrate 2 at an angle to its surface, which in this case, acts as a reflecting mirror. In this case, the incident beam and the beam reflected from the substrate 2 cross in the region 8 over the substrate 2, and at the point of their crossing a standing wave is formed in the direction perpendicular to the surface of the substrate 2. In the antinodes of the standing wave, the regions of stronger field are formed, in which one plasma layer or several plasma layers parallel to the surface of the substrate 2 are formed and maintained. By changing the shape and dimensions of the transverse cross-section of the incident wave beam 17, and by changing the angle of incidence of the beam 7 on the substrate 2, one can control the dimensions of the plasma layer along the substrate 2. In order to achieve a more homogeneous distribution of the plasma along the substrate 2, the second mirror 13 is used to direct the second of the two aforesaid converging beams 17 to the substrate 2 opposite to the reflected beam. Due to this, the design of the plasma reactor according to Paragraph 9 and shown in FIG. 3 provides more homogeneous deposition of the diamond film on the substrate 2.

The plasma reactor shown in FIG. 4 and realizing the method corresponding to Paragraph 5 operates as follows.

The linearly polarized microwave radiation 17 with its frequency 30 GHz and with the transverse distribution of its intensity corresponding to the Gaussian distribution is directed, from the microwave generator 5, to the input of the divider 5, which in this specific case is made as an oversized rectangular waveguide, by means of the mirror 16 and the oversized circular waveguide 14. Due to the effect of image multiplication during propagation of electromagnetic radiation in the oversized rectangular waveguide 15 the Gaussian beam 17 is divided into two equal Gaussian beams 17 with lower intensities. Each of these two radiation beams 17 is directed to the quasi-optical electrodynamic system 7 by means of the sets of the mirrors 11 and 12. The two mirrors 13 of the quasi-optical electrodynamic system 7 direct the two said beams 17 into the region 8 over the substrate 2 opposite to each other. This results in formation of a standing wave in the region 8 along the axis of the beams 17. In the antinodes of the standing wave, the regions of a stronger field are formed, in which several plasma layers perpendicular to the surface of the substrate 2 are localized and maintained. In order to achieve homogeneous deposition of diamond films on the substrate 2, the antinodes of the standing waves are continuously moved along the substrate 2 by means of a mechanical displacement of one of the mirrors 13 parallel to itself to the distance of $\lambda/4$. The design of the plasma reactor corresponding to Paragraph 10 and shown in FIG. 4, similar to the previous design version, also provides homogeneous deposition of the diamond film 3 on the substrate 2.

The plasma reactor shown in FIG. 5 and realizing the method corresponding to Paragraph 6 operates as follows.

The linearly polarized microwave radiation 17 with its frequency 30 GHz and with the transverse distribution of its intensity corresponding to the Gaussian distribution is directed, from the microwave generator 5, to the input of the quasi-optical electrodynamic system 7, which in this specific case is made as one concave metal mirror 13 situated out of the reaction chamber 1, by means of the mirror 16, the oversized circular waveguide 14, and the mirror 12. The mirror 13 directs the converging wave beam 17 via the dielectric window 22 upwards in the direction normal to the surface of the substrate 2, which in this case acts as the reflecting mirror and creates the opposite beam 17. As the result, a standing wave is formed in the direction perpendicular to the surface of the substrate 2. In the antinodes of the standing wave, the regions of the stronger field are formed, in which one plasma layer or several plasma layers parallel to the surface of the substrate 2 are localized and maintained. By changing the dimensions of the transverse cross-section of the incident wave beam 17, one can control the dimensions of the plasma layer along the substrate 2. In this design version, the wave beam 17 is directed to the substrate 2 from below, such that the plasma appears under the substrate. In this case, the convectional gas flow that arises and flows upwards towards the substrate 2 conduces additionally to localization of the plasma layer near the substrate. The design of the plasma reactor corresponding to Paragraph 11 and shown in FIG. 5 is the most small-size and easy-to-make and provides additional possibilities for plasma localization near the substrate 2.

The plasma reactor shown in FIG. 6 and also realizing the method corresponding to Paragraph 6 operates as follows.

The periodic grating 25 made of thin cooled metal rods or tubes 26 and set parallel to the substrate 2 can perform two functions depending on the distance between the said grating and the substrate 2 and on the direction of the electric field intensity vector relative to the axis of the rods (pipes) 26, namely: when the distance to the substrate 2 is arbitrary and the direction of the electric field intensity vector is perpendicular to the axis of the rods (tubes) 26, the grating 25 functions as a cooled radioparent wall, whereas when the distance to the substrate 2 is a multiple of $\lambda/2$ and the direction of the electric field intensity vector relative to the axis of the rods (tubes) 26 is appropriate, it functions as a partially transparent mirror of the quasi-optical resonator.

When the grating 25 is used as a cooled radioparent wall, the plasma reactor shown in FIG. 6 operates as follows.

The linearly polarized microwave radiation 17 with its frequency 30 GHz and with the transverse distribution of its intensity corresponding to the Gaussian distribution is directed from the microwave generator 5, to the mirror 13 of the quasi-optical electrodynamic system 7 by means of the mirror 16, the oversized waveguide 14, and the mirror 12, which system directs the converging Gaussian beam 17 to the grating 25 and substrate 2 in the direction normal to their surfaces or at a low angle to the normal. When the vector of the electric field intensity in the Gaussian wave beam 17 is directed perpendicular to the axis of the rods or pipes 26, the grating 25 becomes transparent for the microwave radiation. In this case, the wave beam 17 reflects from the surface of the substrate 2. As the result, a standing wave is generated in the direction perpendicular to the surface of the substrate 2. In the antinodes of the standing waves, the regions of the stronger field are formed, in which one plasma layer or several plasma layers parallel to the surface of the substrate 2 are localized and maintained. Localization of the plasma is additionally conduced to by the energy heat release into the cooled grating 25 transparent for the microwave radiation. By changing the dimensions of the transverse cross-section of the incident wave beam 17, one can control the dimensions of the plasma layer along the substrate 2. Thus, the design of the plasma reactor corresponding to Paragraph 12 and shown in FIG. 6 provides additional possibilities for localization of the plasma layer near the substrate 2.

When the grating 25 is used as one of the mirrors of the quasi-optical resonator, the plasma reactor shown in FIG. 6 operates as follows.

As in the previous case, the linearly polarized Gaussian beam 17 of the microwave radiation with its frequency f=30 GHz is directed, from the microwave generator 5, to the mirror 16 of the quasi-optical electrodynamic system 7 by means of the mirror 16, the oversized waveguide 14, and the mirror 12, which system directs the converging Gaussian beam 17 to the grating 25 and substrate 2 in the direction normal to their surfaces or at a low angle to the normal. In order to transform the grating 25 into a partially reflecting second mirror of the quasi-optical resonator, the angle between the direction of the electric field intensity in the Gaussian beam 17 and the axis of the rods (tubes) 26 is changed as compared to the previous case. Besides, since in the case of using the grating 25 as a mirror of the quasi-optical resonator, the distance between the grating 25 and the substrate 2 is chosen equal to $\pi/2$, the quasi-optical resonator formed by them has the resonance at the frequency of radiation of the microwave generator 5. In the case of the resonance the amplitude of the electric field in the standing wave is amplified, which conduces additionally to the localization of the plasma layer near the substrate 2 in such a resonator. Plasma localization is also conduced to, as in the previous case, by cooling the metal tubes (rods) of the grating 25. The Q-factor of this quasi-optical resonator is controlled by changing the coefficient of resonator coupling with the Guassian radiation beam 17 by means of changing the angle between the vector of the electric field in the Gaussian beam and the axis of the tubes or rods 26. By changing the dimensions of the transverse cross-section of the incident wave beam 17 here, as in the previous cases, one can control the dimensions of the plasma layer along the substrate 2. The design of the plasma reactor corresponding to Paragraph 14 and shown in FIG. 6 provides the possibility to control localization of the plasma layer.

In the specific case of manufacturing this design version, the gas pump-in system 9 is combined with the periodic grating 25, in which the gas mixture is pumped in via apertures in the hollow tubes 26 of the periodic grating 25, as shown in FIG. 8.

Table 1 lists, for the sake of comparison, the results of calculating (numerical modeling) density of atomic hydrogen in the design versions of the plasma reactors operating at the frequencies of 2.45 GHz and 30 GHz by means of the numerical model known from A. M. Gorbachev et al, Numerical modeling of a microwave plasma CVD reactor, Diamond and Related Materials 10 (2001) p. 342-346. For the frequency of 2.45 GHz, we chose the plasma reactor known from the U.S. Pat. No. 5,311,103, Int. Cl. H01J7/24, dated 1994. For the frequency of 30 GHz, we chose the plasma reactor shown in FIG. 6; it had the quasi-optical resonator, in which the plasma was maintained as one plasma layer. The pressure of the gas mixture in the reaction chambers that contained hydrogen $H_2$ and methane $CH_4$ was 100 Torr. The temperature of the substrate was 900° C. The plasma was maintained at the identical incident power.

TABLE 1

| | Frequency | |
|---|---|---|
| | 2.45 GHz | 30 GHz |
| Electron density, Ne | ~5 $10^{11}$ $cm^{-3}$ | ~5 $10^{12}$ $cm^{-3}$ |
| Maximum density of atomic hydrogen, $[H]_{max}$ | ~2 $10^{16}$ $cm^{-3}$ | ~5 $10^{17}$ $cm^{-3}$ |
| Density of atomic hydrogen near the substrate surface, $[H]_{sur}$ | ~6 $10^{14}$ $cm^{-3}$ | ~$10^{16}$ $cm^{-3}$ |

As seen from Table 1, the density of atomic hydrogen near the substrate surface is more than by an order of magnitude higher in the reactor at the frequency of 30 GHz, than that in the reactor at the frequency of 2.45 GHz. The earlier studies (Goodwin D. G., Butler J. E., in Handbook of industrial diamonds and diamond films, Eds. M. Prelas, G. Popovici, L. K. Bigelow, New York: Marcel Dekker Inc. USA, 1998, p. 527-581) show that such an increase in the density of atomic hydrogen leads to the increase in the rate of the diamond film growth also by an order of magnitude. In the plasma reactor described in the U.S. Pat. No. 5,311,103, Int. Cl. H01J7/24, dated 1994 the rate of growth of quality diamond films is 1-2 μm/h, whereas in the developed reactor it is 10-20 μm/h.

INDUSTRIAL PRACTICABILITY

The developed method of depositing diamond films and the plasma reactor for its realization are based on increasing the rate of deposition (production) of quality diamond films with large areas, which can be used in various fields of science and technology; specifically, they are used to make output windows of high-power microwave sources, gyrotrons, required for additional plasma heating in fusion setups. The method and the device (plasma reactor) developed employ components produced by Russian industries. Currently, two modifications of the plasma reactor are being tested: plasma reactor with four wave beams crossing pair-wise, as is shown in FIG. 2, and plasma reactor with a quasi-optical resonator, as shown in FIG. 6. The developed plasma reactor is ready for small-series production.

It is intended that the foregoing description be only illustrative of the present invention and that the present invention be limited only by the hereinafter appended claims.

We claim:

1. A reactor system for deposition of diamond films from a gaseous phase in a plasma of a microwave discharge, which system contains a microwave generator, a transmission line ending with a quasi-optical electrodynamic system, a reaction chamber with a substrate on a substrate holder placed in the chamber, and a system for pump-in and pump-out of the selected gaseous mixture, the improvement which comprises a quasi-optical electrodynamic system with four concave mirrors focused together towards the plasma and adapted to form a standing microwave in an area near the surface of the substrate, and the transmission line is a circular waveguide with corrugation of its internal surface, which is supplemented with a plane mirror system that transfers therefrom at least four Gaussian beams to the concave mirrors of the said quasi-optical electrodynamic system, so that the four beams are focused towards the plasma.

2. The reactor system of claim 1 wherein the quasi-optical system has the four concave mirrors situated on different sides relative to a region of plasma formation and to direct the microwave radiation as the four Gaussian beams which cross, wherein the crossing is pairwise, and wherein the quasi-electrodynamic system together with a part of the transmission line are installed within the reaction chamber, and wherein the transmission line is supplemented with a divider coupled with a set of the four plane mirrors, which divides one wave beam into the four beams and is installed at an output of the circular waveguide.

3. The reactor system of claims 1 or 2 wherein a system for pumping gas into the reaction chamber into the region of the plasma formation is a concave metal screen with a feeding tube in a central part, and the screen is situated over the substrate holder at an adjustable distance, and the system for pumping the gas out is made as a set of apertures in the substrate support, which has a volume for the evacuated gas mixture, and in this volume the system for water cooling of the upper part of the substrate support is situated.

* * * * *

UNITED STATES PATENT AND TRADEMARK OFFICE
CERTIFICATE OF CORRECTION

| | | |
|---|---|---|
| PATENT NO. | : 7,694,651 B2 | Page 1 of 1 |
| APPLICATION NO. | : 10/526800 | |
| DATED | : April 13, 2010 | |
| INVENTOR(S) | : Anatoly Leontievich Vikharev et al. | |

It is certified that error appears in the above-identified patent and that said Letters Patent is hereby corrected as shown below:

On the Title page, item [54], "HIGH VELOCITY METHOD FOR DEPOSING DIAMOND FILMS FROM A GASEOUS PHASE IN SHF DISCHARGE PLASMA AND DEVICE FOR CARRYING OUT SAID METHOD"
should be -- HIGH VELOCITY METHOD FOR DEPOSITING DIAMOND FILMS FROM A GASEOUS PHASE IN SHF DISCHARGE PLASMA AND A PLASMA REACTOR FOR CARRYING OUT SAID METHOD --

Column 11, line 49 "$\lambda/4$" should be -- $\pm\lambda/4$ --

Column 12, line 66 "mirror 16" should be -- mirror 13 --

Column 13, line 11 "$\pi/2$" should be -- $\lambda/2$ --

Signed and Sealed this

Seventeenth Day of July, 2012

David J. Kappos
*Director of the United States Patent and Trademark Office*

UNITED STATES PATENT AND TRADEMARK OFFICE
CERTIFICATE OF CORRECTION

PATENT NO. : 7,694,651 B2  Page 1 of 1
APPLICATION NO. : 10/526800
DATED : April 13, 2010
INVENTOR(S) : Anatoly Leontievich Vikharev et al.

It is certified that error appears in the above-identified patent and that said Letters Patent is hereby corrected as shown below:

On the Title page, item [54] and at Column 1, lines 1-4, Title, "HIGH VELOCITY METHOD FOR DEPOSING DIAMOND FILMS FROM A GASEOUS PHASE IN SHF DISCHARGE PLASMA AND DEVICE FOR CARRYING OUT SAID METHOD"
should be -- HIGH VELOCITY METHOD FOR DEPOSITING DIAMOND FILMS FROM A GASEOUS PHASE IN SHF DISCHARGE PLASMA AND A PLASMA REACTOR FOR CARRYING OUT SAID METHOD --

Column 11, line 49 "$\lambda/4$" should be -- $\pm\lambda/4$ --

Column 12, line 66 "mirror 16" should be -- mirror 13 --

Column 13, line 11 "$\pi/2$" should be -- $\lambda/2$ --

This certificate supersedes the Certificate of Correction issued July 17, 2012.

Signed and Sealed this
Fourteenth Day of August, 2012

David J. Kappos
*Director of the United States Patent and Trademark Office*